United States Patent
Kyoh

(10) Patent No.: US 8,285,412 B2
(45) Date of Patent: Oct. 9, 2012

(54) SEMICONDUCTOR DEVICE PRODUCTION CONTROL METHOD

(75) Inventor: Suigen Kyoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 538 days.

(21) Appl. No.: 12/480,355

(22) Filed: Jun. 8, 2009

(65) Prior Publication Data
US 2009/0306805 A1    Dec. 10, 2009

(30) Foreign Application Priority Data
Jun. 9, 2008    (JP) ................................. 2008-150985

(51) Int. Cl.
*G06F 19/00*    (2011.01)

(52) U.S. Cl. .......... 700/121; 700/110; 716/52; 702/155; 438/14

(58) Field of Classification Search .................. 700/110, 700/121; 716/52; 702/155; 438/14; 250/252.1, 250/307
See application file for complete search history.

(56) References Cited

U.S. PATENT DOCUMENTS

| | | | |
|---|---|---|---|
| 6,706,543 B2 * | 3/2004 | Tanaka et al. | 438/14 |
| 6,909,930 B2 * | 6/2005 | Shishido et al. | 700/121 |
| 7,403,832 B2 * | 7/2008 | Schulze et al. | 700/110 |
| 7,488,933 B2 * | 2/2009 | Ye et al. | 250/252.1 |
| 7,720,632 B2 * | 5/2010 | Kurihara et al. | 702/155 |
| 7,853,920 B2 * | 12/2010 | Preil et al. | 716/52 |
| 7,915,055 B2 * | 3/2011 | Kurihara et al. | 438/14 |
| 2007/0187595 A1 * | 8/2007 | Tanaka et al. | 250/307 |
| 2007/0238204 A1 | 10/2007 | Kurihara et al. | |

FOREIGN PATENT DOCUMENTS
| | | |
|---|---|---|
| JP | 2005-346510 | 12/2005 |
| JP | 2006-41164 | 2/2006 |

* cited by examiner

*Primary Examiner* — John R. Cottingham
*Assistant Examiner* — Douglas Lee
(74) *Attorney, Agent, or Firm* — Finnegan, Henderson, Farabow, Garrett & Dunner, L.L.P.

(57) ABSTRACT

A semiconductor device production control method includes monitoring, after a production process of a semiconductor device, a process result at a predetermined position of a pattern to which the process is applied, to obtain a deviation with respect to a predetermined target result, quantitatively obtaining a degree of influence on an operation of a semiconductor device from the deviation of the process result, and comparing the degree of influence that is quantitatively obtained with a predetermined allowable margin for operation specifications of the semiconductor device.

20 Claims, 11 Drawing Sheets

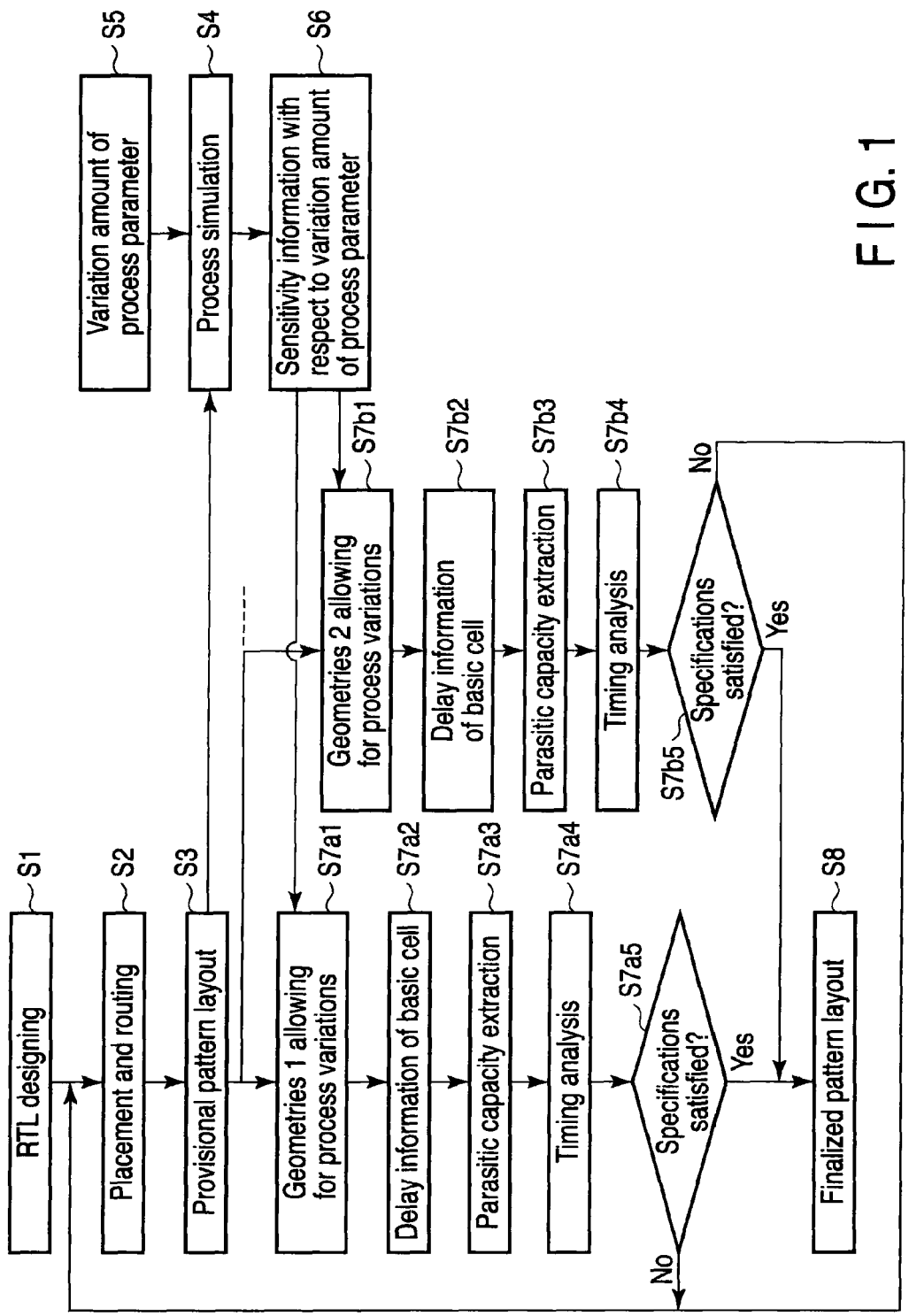
F I G. 1

| Edge No. | Exposure amount sensitivity [nm/%] | Focus sensitivity [nm] | Etching time |
|---|---|---|---|
| Edge1 | 3.8 | $-0.002\Delta^2+0.3\Delta+3.5$ | · |
| Edge2 | 0.8 | $-0.001\Delta^2+0.7\Delta+2.6$ | · |
| Edge3 | 2.1 | $-0.001\Delta^2+0.4\Delta-1.9$ | · |
| Edge4 | 1.6 | $-0.002\Delta^2+0.1\Delta+5.2$ | · |
| Edge5 | 2.4 | $-0.001\Delta^2+3.9$ | · |
| | · | · | · |
| | · | · | · |

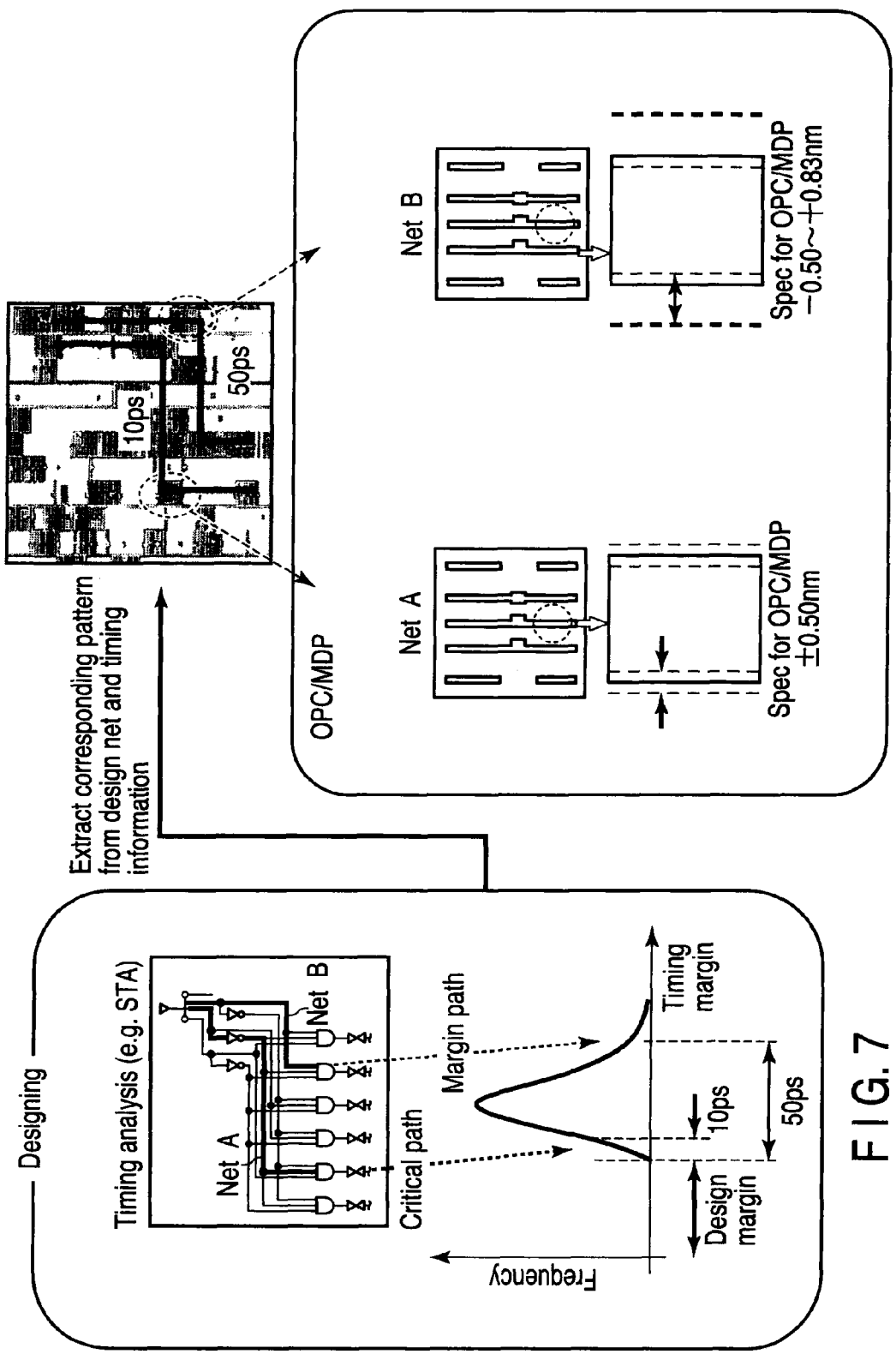
F I G. 7

|  | Error budget of process | Cumulative error |
|---|---|---|
| OPC/MDP | 5% | 5% |
| Photomask production | 25% | 25% |
| Exposure process | 25% | 36% |
| Injection process | 13% | 38% |
| Etching process | 33% | 50% |

FIG. 8

|  | Net A (psec) | Net B (psec) |
|---|---|---|
| OPC/MDP | 3.0 | 5.0 |
| Photomask production | 15.3 | 25.5 |
| Exposure process | 21.4 | 35.7 |
| Injection process | 22.7 | 37.8 |
| Etching process | 30.0 | 50.0 |

FIG. 9

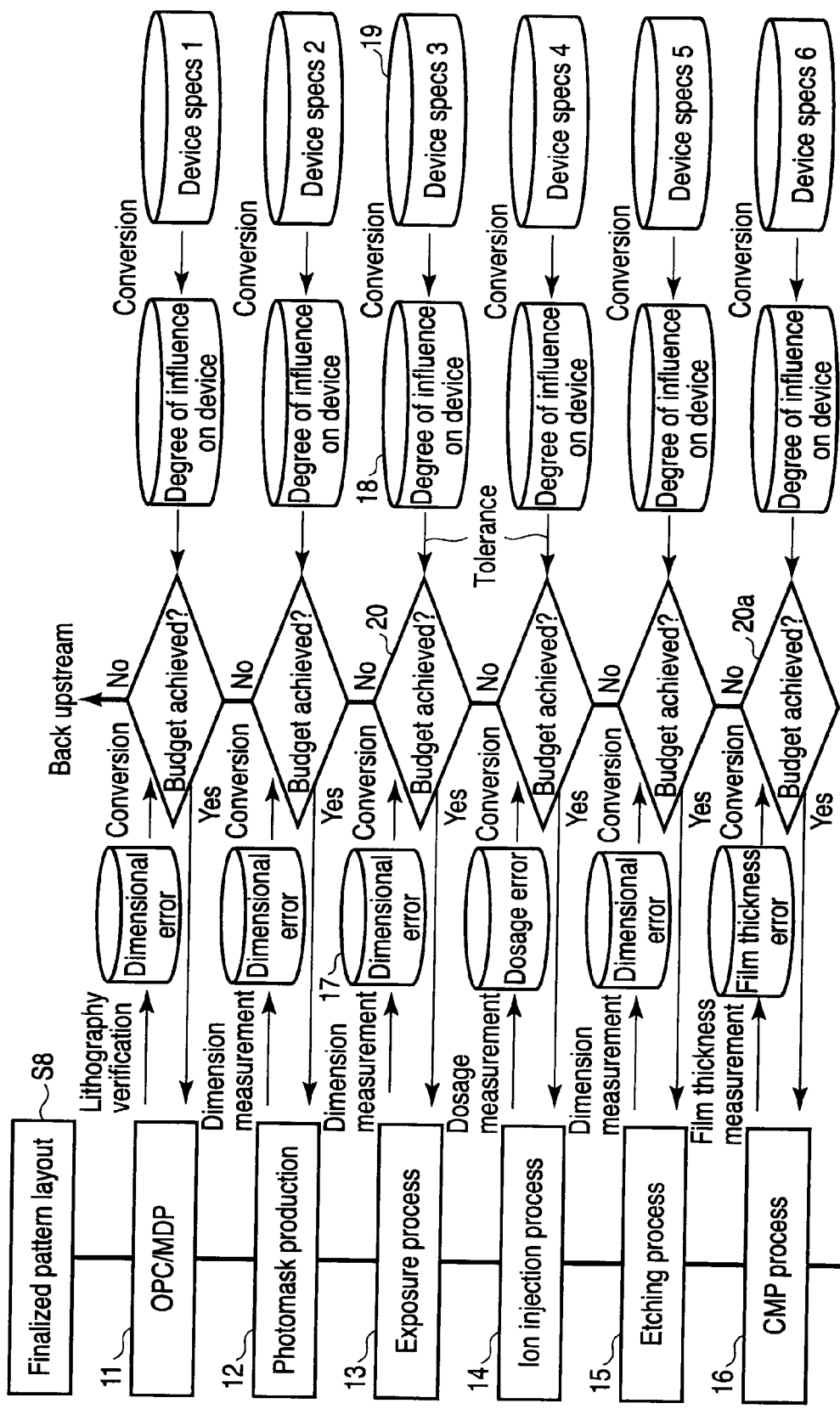
F I G. 12

Wiring capacity/Parasitic capacity extraction results

| Edge No. | Net group Net list | Edge length [um] | C between flip-flops [fp] | ΔC/(unit edge length) /(unit dimension) | R between flip-flops [Ω] | ΔR/(unit edge length) /(unit dimension) |
|---|---|---|---|---|---|---|
| Edge1 | Net_A | 0.9 | 0.65 | 0.02 | 57 | 0.54 |
| Edge2 | Net_A | 0.4 | 0.65 | 0.05 | 57 | 0.54 |
| Edge3 | Net_A | 0.2 | 0.65 | 0.01 | 57 | 0.54 |
| Edge4 | Net_A | 0.3 | 0.65 | 0.02 | 57 | 0.54 |
| Edge5 | Net_B | 0.3 | 0.72 | 0.05 | 96 | 0.54 |
| Edge6 | Net_B | 0.2 | 0.72 | 0.01 | 96 | 0.54 |
| Edge7 | Net_B | 0.2 | 0.72 | 0.00 | 96 | 0.54 |
| Edge8 | Net_B | 0.2 | 0.72 | 0.00 | 96 | 0.54 |
| Edge9 | Net_B | 0.5 | 0.72 | 0.02 | 96 | 0.54 |
| Edge10 | Net_B | 0.7 | 0.72 | 0.05 | 96 | 0.54 |
| Edge11 | Net_C | 0.1 | 0.89 | 0.00 | 83 | 0.54 |
| Edge12 | Net_C | 0.3 | 0.89 | 0.01 | 83 | 0.54 |
| Edge13 | Net_C | 0.3 | 0.89 | 0.05 | 83 | 0.54 |
| Edge14 | Net_C | 0.3 | 0.89 | 0.05 | 83 | 0.54 |

F I G. 15A

Dimension measurement results

| Edge No. | Dimension measurement result [nm] |
|---|---|
| Edge1 | 1.9 |
| Edge2 | 4.8 |
| Edge3 | 2.5 |
| Edge4 | 1.8 |
| Edge5 | 2.4 |
| Edge6 | 2.3 |
| Edge7 | 3.6 |
| Edge8 | 0.9 |
| Edge9 | 2.3 |
| Edge10 | 1.1 |
| Edge11 | 0.2 |
| Edge12 | 4.6 |
| Edge13 | 2.2 |
| Edge14 | 3.2 |

F I G. 15B

SEMICONDUCTOR DEVICE PRODUCTION CONTROL METHOD

CROSS-REFERENCE TO RELATED APPLICATIONS

This application is based upon and claims the benefit of priority from prior Japanese Patent Application No. 2008-150985, filed Jun. 9, 2008, the entire contents of which are incorporated herein by reference.

BACKGROUND OF THE INVENTION

1. Field of the Invention

The present invention relates to a semiconductor device production control method for controlling the execution of, for example, a semiconductor device production process.

2. Description of the Related Art

As the patterns of semiconductor devices become finer, it becomes more difficult to form the patterns on a substrate exactly as specified by the circuit design. For example, a photolithography machine does not have a resolution high enough to keep up with the fineness of a semiconductor device, as a result of which quality of a transferred pattern is deteriorated in the lithography process. In addition, with a low resolution photolithography machine, minor variations in process parameters, such as the exposure and focusing, lead to a reduction in the transferred pattern quality. Such reduced quality of the patterning in the production process has not been taken into account at the designing stage, despite its significant influence on the operation of a semiconductor device.

In the conventional designing process, designing at the register transfer level (RTL), which is a logic design level, and then placement and routing are performed to determine a provisional pattern layout. Thereafter, the provisional pattern layout is checked to see whether it satisfies the timing specifications of the semiconductor device. For instance, timing closure is executed to examine the timing of electrical signals that are transmitted to the signal interconnects and clock signal interconnects and determine whether the timing is within a predetermined error margin. In other words, delay information of basic cells arranged for timing analysis and parasitic capacitance of interconnects are extracted in advance. Based on the extracted information, the timing of electrical signals is analyzed in the timing closure process to determine whether there is any error in the timing of signals transmitted between the signal interconnects and clock interconnects. If any error is found in the timing in the signal interconnects and clock interconnects, the layout has to be redesigned from the placement-routing level. In addition, a signal interconnect particularly susceptible to the timing error is recognized as a critical path in the timing analysis, and this interconnect is used in an operation check test of the semiconductor device or the like.

If process parameters vary in the lithography process and the geometries of the semiconductor device turn out to be different from the designed pattern, reliability of the timing adjustment performed in the timing closure process is lowered. For instance, when no problem is found in the timing closure but the transistor capacitance and the drain current are changed due to a change in the dimensions of the transistor, or a parasitic capacitance is changed due to a change in the dimensions of the metal interconnect, a semiconductor device that is actually produced may cause a malfunction at a certain operational frequency. A possibility of designing with timing allowance in expectation of process variations has been considered. However, this prevents the semiconductor device from increasing its packing density and requires enormous time for the timing closure, and thus it is not a realistic solution.

It has been suggested that, as a method of controlling the semiconductor device production process, a confirmatory test is conducted after all the production processes of the semiconductor device are completed. For instance, the dimensions of the resist are measured after the exposure process to see whether the resist is finished to conform to predetermined values. When the dimensions deviate from the predetermined values, they are compared with the predetermined dimensional specifications. If the dimensional specifications are satisfied, the production process proceeds to the next step. If the dimensional specifications are not satisfied, the resist is removed, and the process goes back to the exposure process.

The dimensional specifications may be defined simply as being within ±10% the target values of the designed dimensions for all the patterns. These values are not directly related to the timing of the interconnects and the leakage current, which are operational specifications of the semiconductor device. This also holds true for other steps of the production process, and the specifications of the measurement results are expressed in simple numbers. These specifications are determined based on the experience that the semiconductor device operates as defined in the specifications. For this reason, the measurement results satisfying the specifications do not mean that the operations of the semiconductor device are guaranteed.

In addition, even if the dimensional specifications are not met, there is a possibility that the semiconductor device is able to operate. In such a case, the product, despite its non-defective quality, may have to be subjected to an unnecessary process or may be discarded as a defective item. In addition, because the same value is given to the specifications for all the production steps, it is difficult to sufficiently control the production process by evaluating the operations with the same specifications if an extremely localized area affects the operation of the semiconductor device.

With the conventional process control method, the semiconductor device production yield can hardly be controlled in a suitable manner, as a result of which the production costs of semiconductor devices have been raised.

As related art, technologies of Jpn. Pat. Appln. KOKAI Publication Nos. 2006-41164 and 2005-346510 are known.

BRIEF SUMMARY OF THE INVENTION

According to a first aspect of the present invention, there is provided a Semiconductor Device Production Control Method comprising: monitoring, after a production process of a semiconductor device, a process result at a predetermined position of a pattern to which the process is applied, to obtain a deviation with respect to a predetermined target result; quantitatively obtaining a degree of influence on an operation of a semiconductor device from the deviation of the process result; and comparing the degree of influence that is quantitatively obtained with a predetermined allowable margin for operation specifications of the semiconductor device.

According to a second aspect of the present invention, there is provided a Semiconductor Device Production Control Method comprising: monitoring, after a production process of a semiconductor device, a process result at a predetermined position of a pattern to which the process is applied, to obtain a deviation with respect to a predetermined target result; obtaining a process tolerance from a predetermined allowable margin of operation specifications of a semiconductor device and a degree of influence with respect to the deviation of the process result on an operation of the semiconductor device; and comparing the tolerance that is obtained with the obtained deviation of the process result.

According to a third aspect of the present invention, there is provided a semiconductor device production control program which causes a computer to perform comparing a degree of influence on an operation of a semiconductor device with a predetermined allowable margin for operation specifications of the semiconductor device, the degree of influence being quantitatively obtained based on a deviation of a pattern to which a semiconductor device production process is applied with respect to a predetermined target value at a predetermined position of the pattern.

BRIEF DESCRIPTION OF THE SEVERAL VIEWS OF THE DRAWING

FIG. 1 is a flowchart of a semiconductor device production control method according to the first embodiment.

FIG. 7 is a diagram for showing a timing closure process.

FIG. 8 is a diagram for showing the relationship between the process steps of gate pattern formation and error budgets.

FIG. 9 is a diagram for showing an example of device specifications for each process step with respect to different nets.

FIG. 12 is a diagram for showing the structure of a semiconductor device production control method according to the fourth embodiment.

FIGS. 15A and 15B are diagrams for explaining the sensitivity of an interconnect pattern.

DETAILED DESCRIPTION OF THE INVENTION

Figure 2:
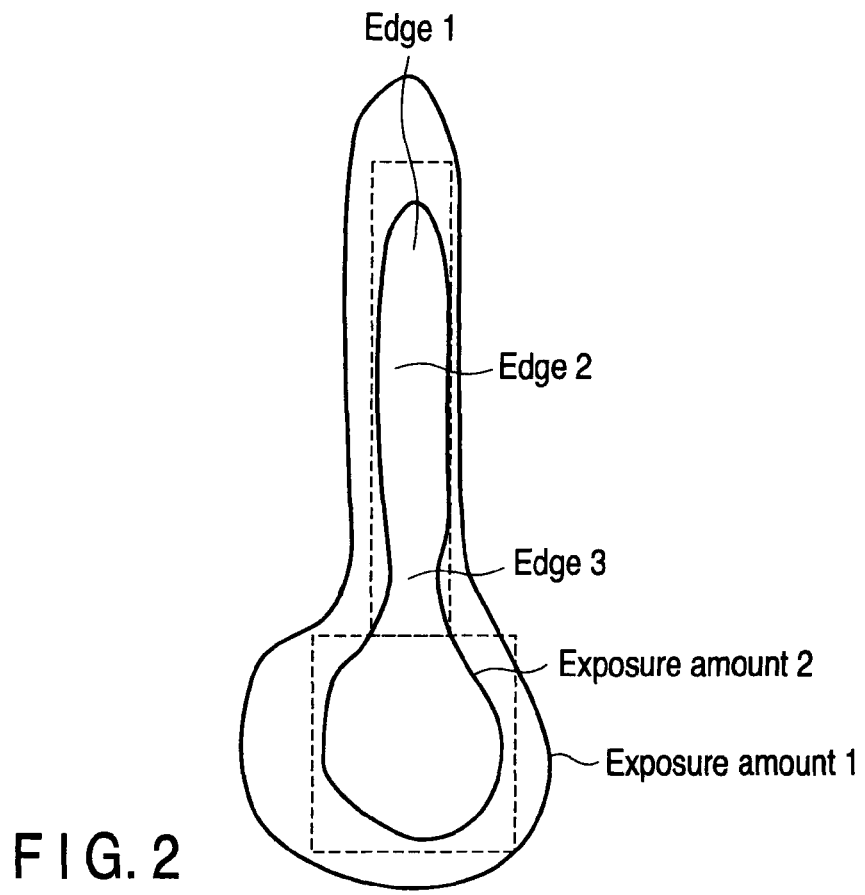
FIG. 2 is a diagram for showing an example of a method of obtaining sensitivity information with respect to process variations, indicating exposures and pattern edge positions.

Embodiments of the present invention will be explained below with reference to the attached drawings.

First Embodiment

FIG. 1 shows a semiconductor device design flow according to the first embodiment. Yields of the semiconductor device are optimized by assigning results of process parameter variations to local positions in a pattern layout and predicting the degree of influence of the variations on the properties of the device.

As indicated in FIG. 1, RTL designing, which is logical designing of the semiconductor device, is first performed (S1). The placement and routing is conducted in accordance with this RTL designing (S2), and a provisional pattern layout that serves as an original drawing for a photomask is created (S3).

This provisional pattern layout is used to perform, for example, lithography and etching simulations so that the dimensions of the provisional pattern layout realized on a semiconductor substrate can be predicted (S4). The simulations (S4) are conducted with allowance for variations of process parameters in consideration of variations in different processes. The variations of parameters are stored, for example, in a database in advance (S5).

The results obtained from a simulation vary in accordance with the processes. For instance, in a lithography or etching simulation, the geometries of a pattern formed on the substrate are obtained, whereas in an ion-injection simulation, device properties such as a switching voltage, on-current and off-current are obtained. Such process simulations are performed under different conditions, and the results obtained in accordance with the variation in each process are stored in a database as sensitivity information with respect to the variation of the process parameters (S6). The determination of the sensitivity information will be described later.

Next, whether the specifications of the semiconductor device are satisfied is checked by using the sensitivity information calculated in the above process simulation and stored in the database (S6) and actual process parameter variations.

Here, the process parameters, including parameters of a process that especially affects the specifications of the semiconductor device, are modified. When more than one process is taken into consideration, variations of the processes may be combined in the form of matrix. After a combination of process parameter variations is determined, the results of the process parameter variations are derived by use of the database (S6). The degree of influence on the properties of the semiconductor device can be thereby quantified. When the degree of influence satisfies the specifications of the semiconductor device, high yields can be expected in the actual production. In this case, the provisional pattern layout becomes a finalized pattern layout. On the other hand, when the combination of variations of highly frequent process parameters does not satisfy the specifications of the semiconductor device, the yield is expected to be low. Thus, in order to modify portions that have especially large influence, the placement and routing is executed again to redesign a provisional pattern layout.

In particular, as indicated in FIG. 1, the geometries of a pattern are obtained by allowing for variations of the lithography process (S7a1) on the basis of the provisional pattern layout (S3) and the sensitivity information stored in the database (S6). Delay information of a flip-flop circuit as a basic cell and a parasitic capacitance of wirings are extracted from the pattern geometries (S7a2 and S7a3). Next, a timing analysis is performed to see whether the provisional pattern layout satisfies the timing specifications of the semiconductor device (S7a4).

Examples of a timing analysis include a timing closure process, with which, for example, transmission timing (or delay information) of a signal between interconnects is checked to see whether the timing (or delay information) is within a predetermined error margin.

Thereafter, it is determined whether the result of the timing analysis satisfies the specifications of the semiconductor device (S7a5). When it is determined that the result of the timing analysis satisfies the specifications of the semiconductor device, high yields can be expected in actual production. Thus, the provisional pattern layout becomes the finalized pattern layout (S8).

On the other hand, when it is determined that the result of the timing analysis does not satisfy the specifications of the semiconductor device, the yields of the semiconductor device are expected to be low. Thus, the control proceeds to the placement and routing step (S2), where the placement and routing and the provisional pattern layout (S3) are redone.

Moreover, when multiple processes are taken into consideration, variations for the processes may be combined in the form of matrix. In other words, at Step S7a1 of FIG. 1, pattern geometries are obtained by allowing for variations of the lithography process, based on the provisional pattern layout (S3) and the sensitivity information in the database (S6).

In contrast, at Step S7b1, geometries of the pattern are obtained by allowing for, for example, variations of the etching process from the provisional pattern layout (S3) and the sensitivity information in the database (S6). The delay information of the basic cell and the parasitic capacitance of the interconnects are extracted from the geometries (S7b2 and S7b3). Then, a timing analysis is conducted to see whether the provisional pattern layout satisfies the timing specifications of the semiconductor device (S7b4).

Thereafter, it is determined whether the result of the timing analysis satisfies the specifications of the semiconductor device (S7b5). When it is determined that the result of the timing analysis satisfies the specifications of the semiconductor device, high yields can be expected in actual production. Thus, the provisional pattern layout is determined to be the finalized pattern layout (S8).

On the other hand, when it is determined that the result of the timing analysis does not satisfy the specifications of the semiconductor device, the yields of the semiconductor device are expected to be low. Thus, the control proceeds to the placement and routing step (S2), where the placement and routing and the provisional pattern layout (S3) are redone.

According to the first embodiment, a process simulation is performed with the process parameters of the provisional pattern layout including variations of the parameters, and the degree of influence on the semiconductor is quantified from the geometries of the pattern generated from the simulation. Thus, the variations of the process parameters for each process can be quantified. Based on the degree of influence and the provisional pattern layout, pattern geometries are selected by allowing for the variations of the process, and the timing analysis is thereby conducted.

This means that a semiconductor device is evaluated, not based on the geometry of the pattern itself on the provisional pattern layout, but based on the operability of the semiconductor device by predicting the degree of influence that the variations of the process parameters have on the semiconductor device. Thus, even when the geometry of the pattern is deformed in the process, as long as the final product is operable as a semiconductor device, it is dealt with as a non-defective product. Thus, the number of defective products can be reduced, and a high-yield design pattern can be achieved.

Furthermore, the present embodiment is advantageous in that the costly, time-consuming process simulation does not have to be repeated because the degree of influence of the variations of the process parameters is stored in the database in advance (S6).

Figure 3:
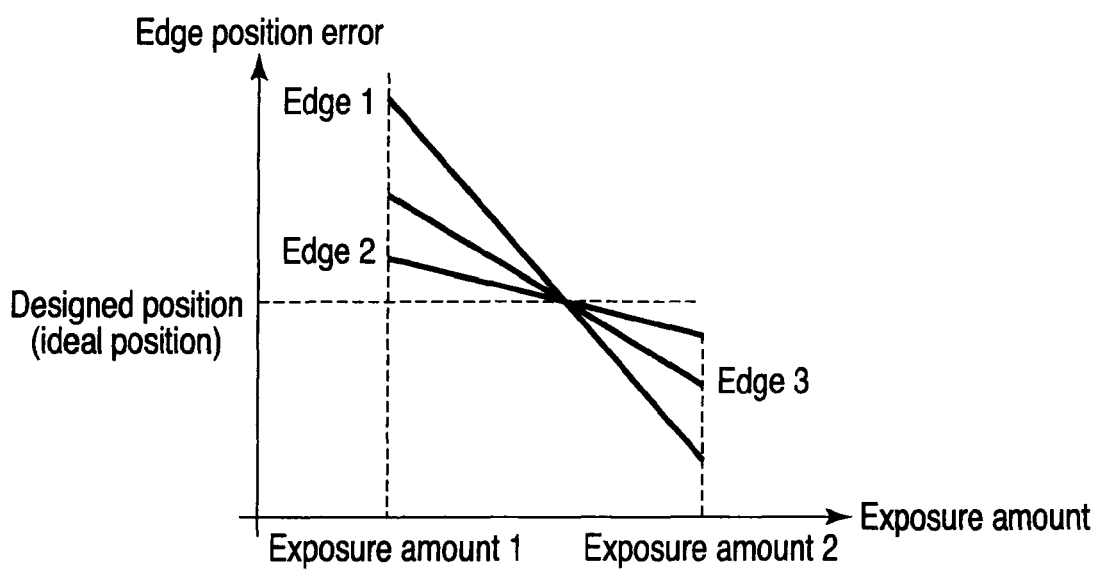
FIG. 3 is a diagram for showing an example of a method of obtaining sensitivity information with respect to process variations, indicating the relationship between exposure and positional deviation of the pattern edge.

FIGS. 2 and 3 show an example of a method of obtaining the sensitivity information indicated in FIG. 1. The explanation will mainly focus on the method of obtaining the sensitivity information regarding the edge positions of the exposure process.

At Step S3 of FIG. 1, when the provisional pattern layout is determined, optical proximity correction (OPC) or the like is implemented by use of this pattern layout to determine a mask pattern. Thereafter, at least two possible exposures are selected, with which process simulations are executed as lithography simulations (S4).

As a result of the simulations, geometrical information indicated in FIG. 2 is obtained. FIG. 2 shows the results of the lithography simulations for the gate pattern of a MOS transistor. With respect to a design pattern indicated by dashed lines, the geometrical information, exposure 1 and exposure 2, is obtained as the simulation results.

FIG. 3 is a graph showing the relationship between the exposure and the edge position error obtained from the geometrical information of FIG. 2, with the horizontal axis representing variations of the exposure as a process parameter, and the longitudinal axis representing an error of the edge position of the pattern generated in accordance with the variations of the exposure. The edge positions are indicated in FIG. 2. On this graph, the inclination of each line 9 indicates sensitivity information of an edge position, showing how the edge position changes in accordance with the exposure.

For instance, the position of the edge 1 changes significantly in accordance with the variations of the exposure, but the position of the edge 2 changes less in accordance with the variations of the exposure than the position of the edge 1. When the variations differ in the same edge, different edge positions may be defined, for example, as the edge 2 and edge 3 to obtain edge position errors in accordance with the exposure. For instance, sensitivity information measuring points may be arranged at regular intervals on the edge of the design pattern. Then, sensitivity information can be effectively accumulated by integrating items of the sensitivity information that fall within a margin of a specific value on adjacent edge points.

In the above example, sensitivity information of the edge positions is obtained by using the exposure as a process parameter. The embodiment is not limited thereto, however, and the sensitivity information may be obtained by changing process parameters of different processes. For instance, focus parameters are varied in addition to the exposure, and the sensitivity information of edge positions may be obtained with respect to the exposure.

Figures 4, 5:
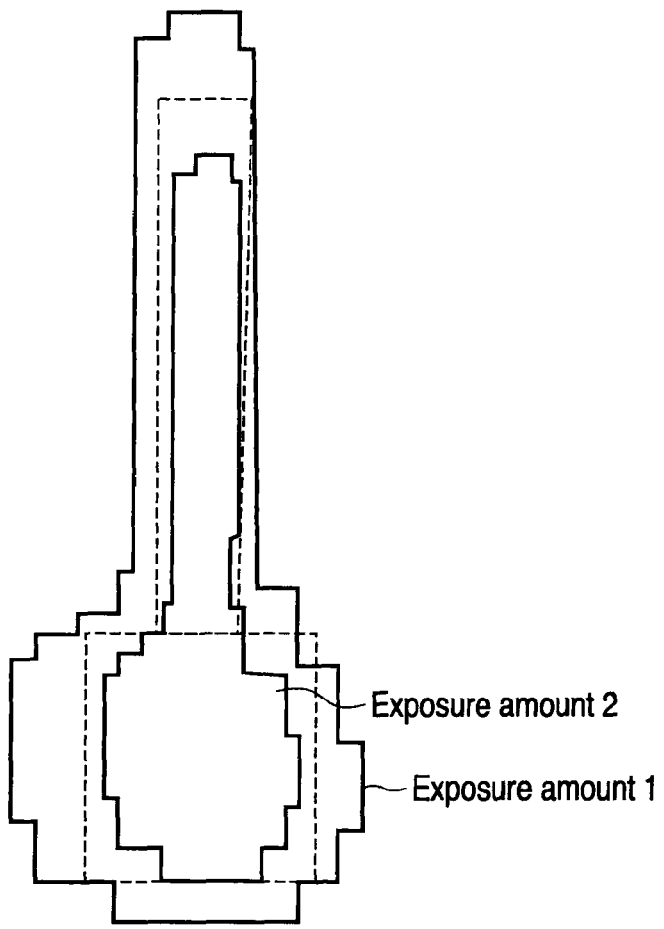
FIG. 4 is a diagram for showing a database of sensitivity information.
FIG. 5 is a diagram for showing the exposures and edge positions predicted from the sensitivity information of FIG. 4.

FIG. 4 shows the database of the sensitivity information that is obtained in the above manner. This database maintains the exposure sensitivity, focus sensitivity and etching time in association with the number denoting the edge position (edge No.). The geometries illustrated in FIG. 5 can be predicted by use of the sensitivity information in association with the process variations and specific values of possible process variations in the actual production. On the basis of the geometries, the degree of influence on the target device property can be quantitatively evaluated.

With such a method, information can be shared by a person engaged in processing, who understands the sensitivity information that varies in accordance with the process parameters but cannot evaluate the degree of influence on the device properties, and a person engaged in designing, who knows the degree of influence on the device properties but cannot make an evaluation regarding the sensitivity information that varies in accordance with the variations of the process parameters. Because the results of the variations of the process parameters can be readily predicted, whether the specifications of the semiconductor device are satisfied can be accurately and promptly predicted at the designing stage.

According to the first embodiment, the timing analysis is conducted by obtaining the geometries allowing for the process variations from the provisional pattern layout and extracting the delay information of a basic cell and the parasitic capacitance from the obtained geometries. If it is determined as a result of the timing analysis that the final product satisfies the operational specifications of a semiconductor device even though the dimensional specifications of the pattern are not satisfied, the product can be dealt with as a non-defective product. Hence, product yields can be improved in comparison with the conventional technologies in which the evaluation is based simply on the dimensional specifications of the pattern.

Second Embodiment

The second embodiment will now be explained.

The production of a semiconductor device includes different processes such as exposure, ion injection and etching. In these processes, when, for example, the dimensions of the interconnect pattern have some deviation from design values, a signal transmission delay occurs in accordance with the deviation. In conventional technologies, allowable errors have been determined with reference to the most critical path so that the operability of the semiconductor device can be attained even if such a deviation occurs. For this reason, for an interconnect pattern that is not a critical path, when the product can operate as a semiconductor device despite a deviation larger than the allowable error, the semiconductor having this interconnect is dealt with as a defective product once the deviation exceeds the allowable error. More specifically, in conventional technologies when the allowable error of the dimensions of the interconnect pattern as a critical path is determined, for example, to be 10%, the allowable error of interconnect patterns other than a critical path is also 10%, although 15% is still operable. This reduces the production yields.

The second embodiment can be summarized as follows. When the production processes of a semiconductor device are conducted on the basis of a finalized pattern layout, dimensions of the pattern, for example, are measured as a process variation after each process, and the significance of the influence of an error between the measured dimensions and the design values on the signal transmission timing is calculated. For this reason, variations of the signal transmission timing in accordance with dimensional errors are calculated in advance as sensitivity, and stored in the database. The measured dimensional error is converted to a signal transmission timing by use of this sensitivity, and it is determined whether the converted transmission timing is within the allowable range of the device specifications defined for each process. The production processes are controlled in accordance with the determination results.

It should be noted that the process variation is not limited to dimensional errors. For instance, in the ion injection process, an error in a measured dosage of impurity ions is the process variation, or in the CMP process, an error in the film thickness measured after the process is the process variation.

Figure 6:
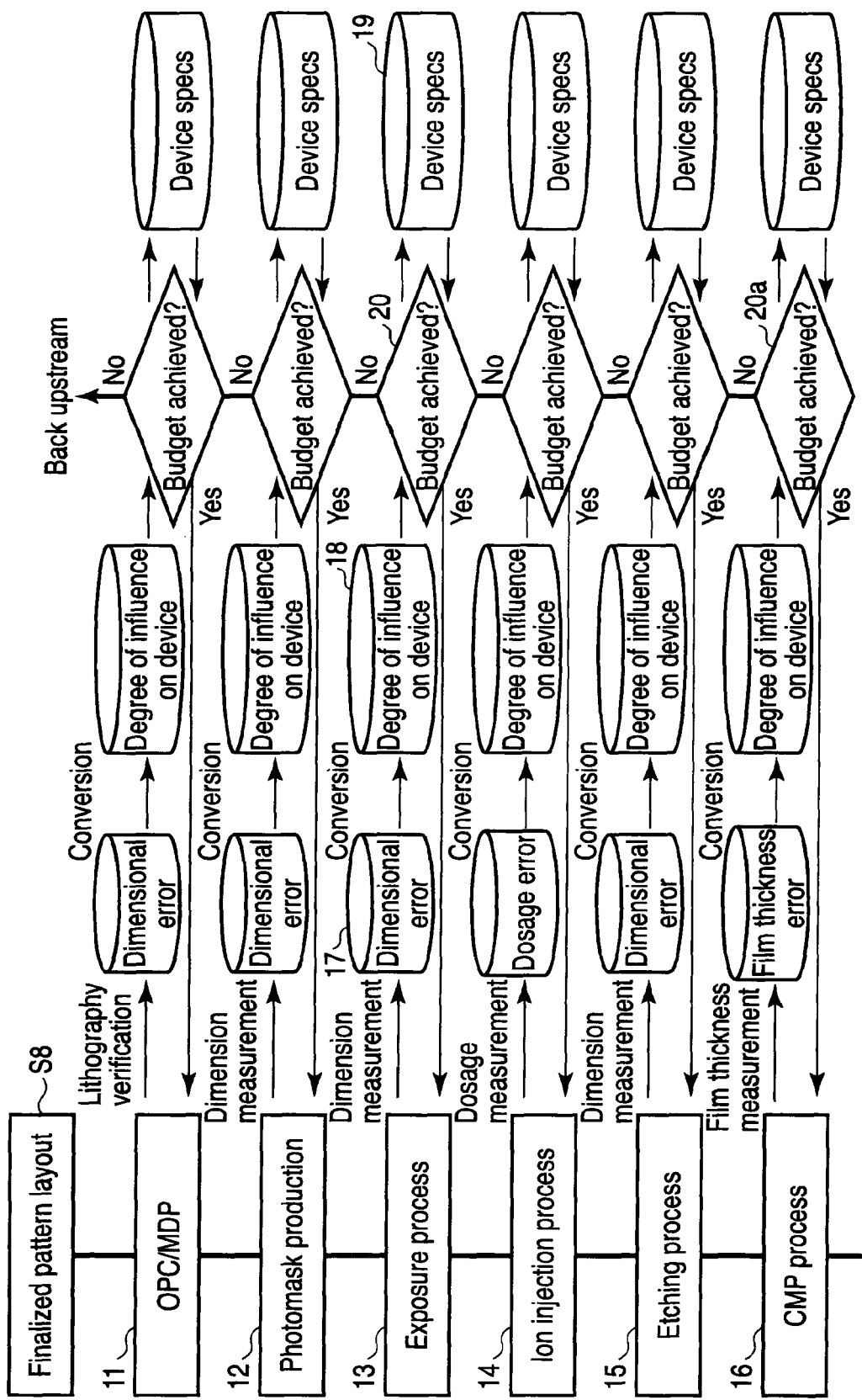
FIG. 6 is a diagram for showing the structure of a semiconductor device production control method according to the second embodiment.

FIG. 6 shows the semiconductor device production control method according to the second embodiment.

In FIG. 6, the production processes of the semiconductor device are sequentially executed based on the finalized pattern layout of FIG. 1 (S8). For example, an optical proximity correction (OPC)/mask data processor (MOP) process 11, a photomask production process 12, an exposure process 13, an ion injection process 14, an etching process 15, and a CMP process 16 are sequentially performed. These processes are executed by determining the influence that the process result has on the device after the completion of each process.

In other words, when these processes are executed, measurements are carried out for the pattern dimensions, the impurity dosage or the film thickness as a process result, and an error (variation) between the measured value and the design value is calculated. Such an error is converted to a signal transmission timing as a degree of influence on the device, based on the sensitivity. Then, it is determined whether the transmission timing is within the allowable range of the device specifications.

In particular, in the exposure process 13, for example, the dimensions of a resist on the semiconductor substrate are measured after the development by use of a scanning electron microscope (SEM) or the like that is not shown in the drawing. The error between the measured dimensions and the design values are stored in a storage unit 17. The sensitivity of the exposure process is obtained in advance in the designing stage in relation to the error between the measured dimensions and the design values, and stored as a database in the storage unit 18. Based on the sensitivity stored in this storage unit 18, the error in the measured resist dimensions is converted to the signal transmission timing. For instance, the product of the measured dimensional error and the sensitivity is calculated. With such a method, the degree of influence that the result of the exposure process has on the signal transmission timing of the semiconductor device can be predicted. The dimensions of the resist pattern are measured, the error between the measured dimensions and the designed dimensions is extracted, and the product of this error and the sensitivity of the signal timing to the error represents the degree of influence on the signal transmission timing.

Thereafter, the device specifications for the exposure process 13 that are pre-stored in the database are read, for example, from a storage unit 19 that is arranged for each process. A determination unit 20 determines whether the converted signal transmission timing is within the allowable range of the device specifications. When it is determined that the signal transmission timing is within the allowable range of the device specifications, or in other words, when it is within an error budget, it is determined that the exposure process 13 is in good condition. Thus, the production proceeds to the next process, which is the ion injection process 14.

When it is determined that the timing does not fall within the allowable range, it is determined, for example, whether the exposure process 13 can be redone. When it is possible, the exposure process is re-executed.

The above device specifications are determined, for example, based on the result of the timing closure that is performed when finalizing the pattern layout.

FIG. 7 shows the timing closure. As indicated in FIG. 7, a timing margin (allowance) is quantified for each interconnect net of the semiconductor device in the designing stage. For instance, among the multiple interconnects, some interconnects are determined as strict-timing critical paths (NetA) having a timing margin of 10 ps or less, and some others are determined as large-margin margin paths (NetB) having a timing margin of 50 ps or greater.

On the other hand, when the design margin of the entire semiconductor device is 50 ps, the timing margins of the NetA and NetB are 60 and 100 ps, respectively. If the timing of each interconnect falls within the corresponding predetermined timing margin as a result of the process variations generated in the production process of the semiconductor device, this semiconductor device is a non-defective product that satisfies the device specifications.

The production of the semiconductor device comprises multiple processes as indicated in FIG. 6, and process errors are accumulated as the device goes through the processes. For example, when it is assumed that, a 50% error of the device specifications is assigned to the gate pattern formation step, the assigned device specifications are divided as error budgets to the processes of the gate pattern formation, as indicated in FIG. 8. The total of error budges is 50%. Based on the divided errors, specific device specifications are determined for the NetA and NetB.

FIG. 9 shows an example of the device specifications of the processes for the NetA and NetB. As indicated in FIG. 9, timing margins are given to the NetA and NetB in correspondence with the different processes.

As indicated in FIG. 6, for example, when the exposure process 13 is completed, the dimensions of the gate pattern is measured by use of the SEM or the like, and the measured dimensional error is converted to a signal transfer timing based on the sensitivity to obtain the degree of influence on the timing. This result is compared with the device specifications of the exposure process shown in FIG. 9. For a gate pattern that belongs to the NetA, the signal transmission timing less than or equal to 21.4 ps defined as the device specification is acceptable. For a gate pattern that belongs to the NetB, the signal transmission timing less than or equal to 35.7 ps defined as the device specification is acceptable. Then, the production proceeds to the next process.

Patterns corresponding to the critical path and the margin path are extracted from the designed circuit and timing information of FIG. 7, and the error ranges of these patterns in each process are determined. In the case of the OPC/MDP process illustrated in FIG. 7, the error range of the critical path is, for example, 0.50 nm, and the error range of the margin path is, for example, between −0.50 and +0.83 nm.

In addition, sensitivity information may be calculated as the degree of influence that the pattern obtained after each pattern has on the device, from the pattern error range and the timing margin. In other words, the relationship between the pattern error range and the timing can be obtained as a coefficient.

According to the second embodiment, the semiconductor device of each process is evaluated as to defectiveness by measuring the dimensions and impurity ion dosage as process results, converting the dimensional error to the signal transmission timing based on the degree of influence on the device, and determining whether the transmission timing falls within the allowable range of the device specifications. According to the process control of the second embodiment, because the control is performed directly onto the operation of the semiconductor, a defective product can be detected at an early stage, and misdetermination of a non-defective product as a defective product can be minimized. Hence, defectiveness of the device can be accurately determined, in comparison with the conventional technology with which a determination is made as to whether a physical quantity that is not directly related to the properties of the semiconductor device, such as the pattern dimensions and the impurity ion dosages is within an allowable range. The yields can be thereby improved.

Third Embodiment

According to the second embodiment, the device specifications are controlled for each process. In contrast, the third embodiment is characterized in that the device specifications for the processes are controlled altogether.

Figure 10:
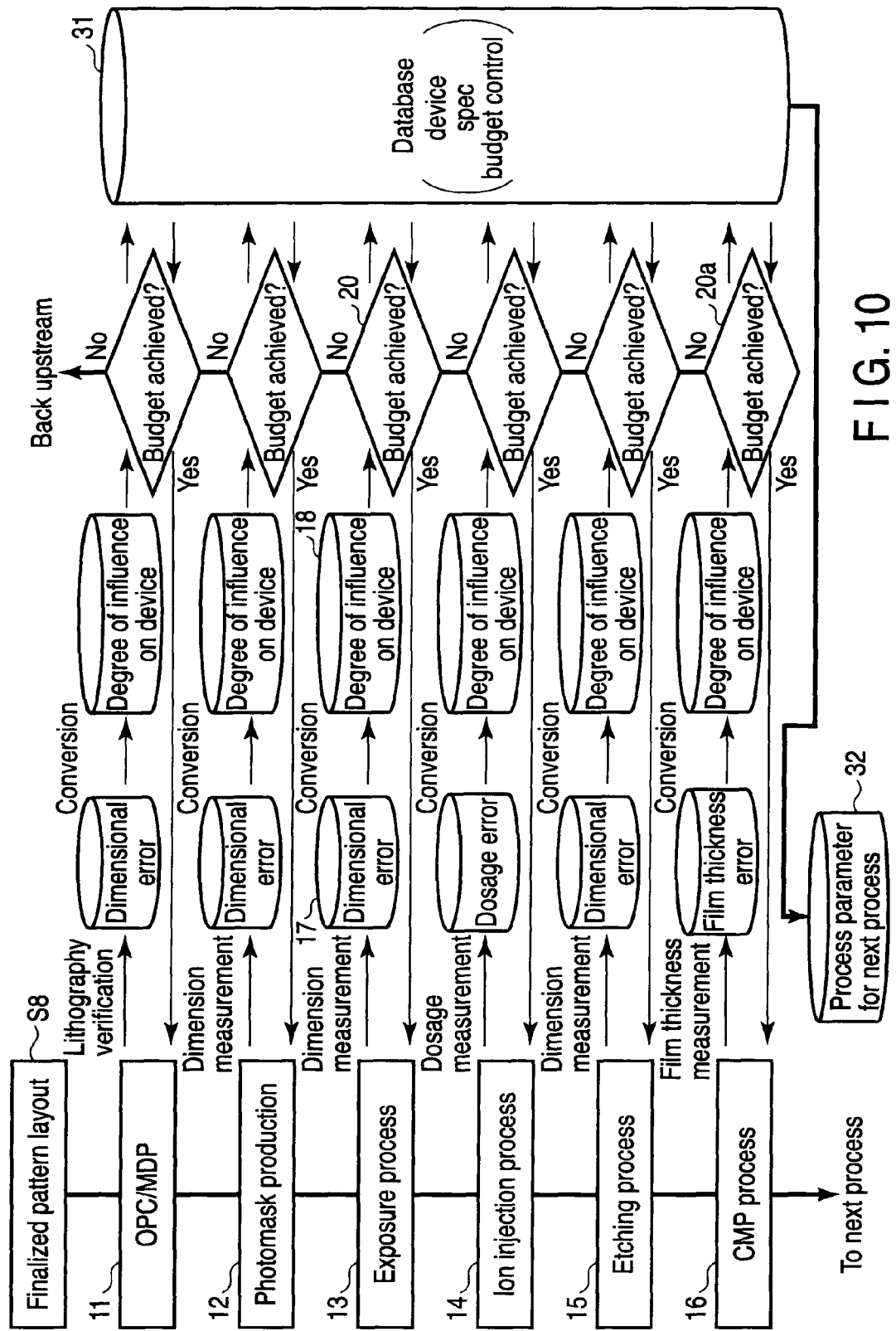
FIG. 10 is a diagram for showing the structure of a semiconductor device production control method according to the third embodiment.

FIG. 10 shows a process control method according to the third embodiment, and portions overlapping the second embodiment are given the same reference numerals.

The process control method of the third embodiment does not provide each process with fixed device specifications, but the method incorporates a database in order to flexibly control and distribute the error budget. In other words, a database 31 illustrated in FIG. 10 stores therein the process results for each wafer on which semiconductor devices are formed, the device specifications for each process, and the degree of influence on the device specifications altogether.

Each time a process is completed, the device specifications for the process are retrieved from the database 31, and the determination unit 20 compares the signal transmission timing converted based on the degree of influence on the device with the device specifications to make a determination, in the same manner as in the second embodiment.

According to the second embodiment, for example, when the determination unit 20a determines after the CMP process 16 that the device specifications are not satisfied, the production is not allowed to proceed to the next process.

In contrast, according to the third embodiment, even when the determination unit 20a determines that the device specifications are not satisfied, the production can still proceed to the next process. In other words, if there is a possibility that the device specifications become satisfied by modifying the process parameter of the next process, a modified process parameter 32 of the next process is output from the database 31, and the production proceeds to the next process.

In particular, it is assumed that, at the step of producing a semiconductor device with multiple interconnect layers, the pattern of the second interconnect layer on a wafer is formed thinner than the predetermined value due to variations in the exposure. If this is the case, all the device specifications for the second interconnect layer forming step cannot be satisfied. If, however, the pattern of the third interconnect layer deposited on the second interconnect layer is formed wider than the predetermined value in such a manner as to complement the formation result of the second interconnect layer, all the device specifications for the third interconnect layer forming step may be satisfied.

Figure 11:
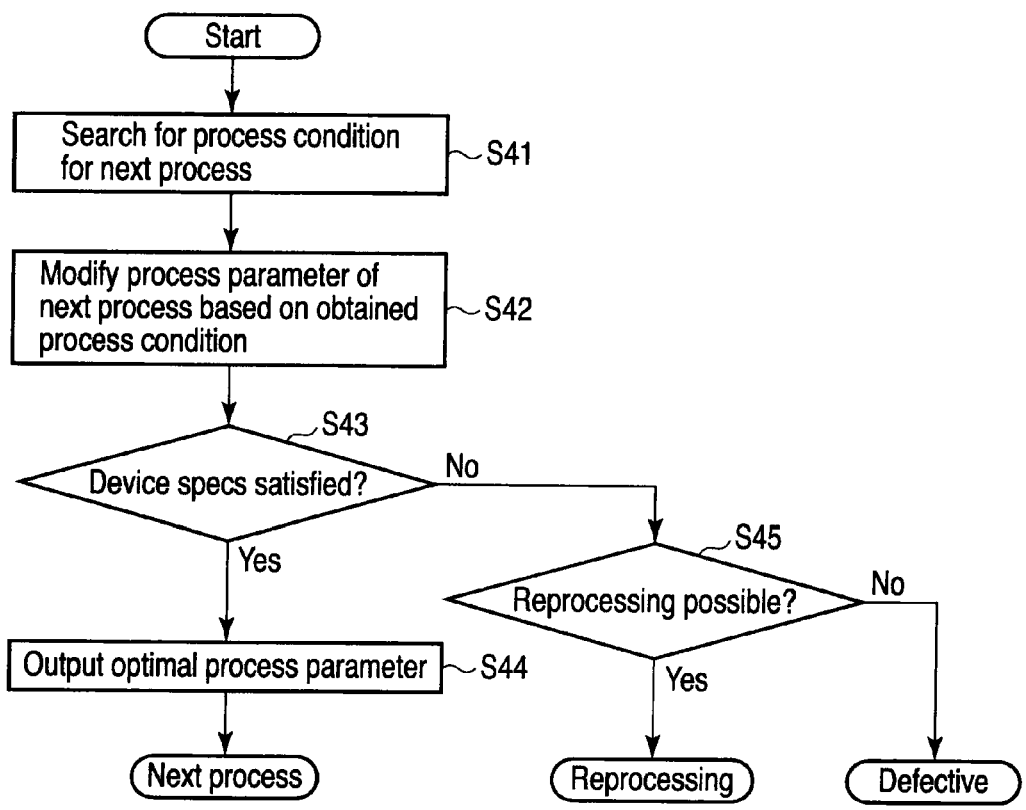
FIG. 11 is a flowchart for showing an example of a method of modifying a process parameter.

In such a case, the following operation may be executed by a processing program stored in the database 31 indicated in FIG. 11. First, the device specifications, the degree of influence on the device and the process conditions for the subsequent processes are searched for through the database 31 (S41). The obtained process conditions are modified in accordance with the result of the current process (S42). That is, the process conditions are modified so that the pattern of the third interconnect layer formed on the second interconnect layer becomes wider than the predetermined value. Next, whether the pattern of the third interconnect layer formed on the basis of the modified process conditions would satisfy the device specifications in the next process is determined (S43). When it is determined that the device specifications would be satisfied, optimal process parameters are output for the next process (S44), and the wafer is carried to the next process. In the next process, the process is executed in accordance with the optimal parameters that are designated.

When there is a low possibility of satisfying the device specifications, it is determined whether the reprocessing can be conducted (S45). If it is determined that the reprocessing can be conducted, the current process is repeated. If it is determined that the reprocessing cannot be conducted, the semiconductor device is regarded as a defective product.

The above explanation is given by using the CMP process 16 as an example. The method is not limited thereto, however.

It is applicable, for example, to processes such as the exposure, ion injection and etching.

According to the third embodiment, the database 31 is incorporated to store all the process results for each wafer on which semiconductor devices are formed, the device specifications for each process, and the degree of influence on the device specifications. The device specifications for each process are output from the database 31. Furthermore, the process results and device specifications for each process are not simply compared with each other, but when it is determined, by comparing the process results with the device specifications, that the comparison results do not satisfy the device specifications, whether the final device specifications would be satisfied in the subsequent processes is determined. If whether the final device specifications would be satisfied in the subsequent processes, the production can be continued without discarding the wafer. In other words, the final device specifications can be satisfied by feed-forwarding. Hence, the yields of the semiconductor device can be further improved.

Fourth Embodiment

FIG. 12 shows the fourth embodiment, which is a modified example of the second embodiment. In FIG. 12, overlapping portions with FIG. 6 are given the same reference numerals.

According to the second embodiment, after each process is completed, the pattern dimensions or the like are measured as the process results, the measurement results are converted to transmission timing of a signal that acts on the operation of the device, based on the degree of device influence, the conversion results are compared with the device specifications, and thereby the acceptability of this process is determined.

In contrast, according to the fourth embodiment, the tolerance that indicates the allowance for each process is determined by use of the device specifications that is stored in the storage unit 19 arranged for each process and the degree of device influence that is stored in the storage unit 18, as illustrated in FIG. 12. The determination unit 20 of each process compares the tolerance with, for example, the dimensional error, and determines whether the dimensional error is within the tolerance. If the dimensional error is within the tolerance, the production proceeds to the next process. In a similar manner, the measurement error and the tolerance are compared for the dosage, the film thickness and the like.

More specifically, at the OPC/MDP step in the gate pattern formation process, the device specifications for the NetA and NetB are 3.0 and 5.0 ps, respectively, as indicated in FIG. 9. When the degree of influence that the gate pattern has on the device or in other words, influence that the dimensional error in the device pattern on the timing is 6.0 ps/nm, the tolerance of the gate pattern that belongs to the NetA is 3.0/6.0=0.5 nm, while the tolerance of the gate pattern that belongs to the NetB is 5.0/6.0=0.83 nm. These are the tolerances with respect to timings, and are limited to the gate pattern in the wider direction.

On the other hand, when the gate pattern becomes thinner, the tolerance is determined in accordance with the gate leakage current, which is a different device specification. Regardless of whether it belongs to the NetA or NetB, 0.5 nm is determined based on the device specification of the leakage current and the degree of influence that the gate dimensions have on the leakage current. Thus, the tolerance of the gate dimensions for the NetA is determined to be between −0.5 and +0.5 nm as a specification, and the tolerance of the gate dimensions for the NetB is determined to be between −0.5 and +0.83 nm as a specification.

According to the fourth embodiment, the device specifications can be converted to a tolerance having a predictable value. Thus, the acceptability of each process can be readily determined by use of the tolerance, which facilitates the control of the processes.

In addition, with the clearly defined tolerance, the specifications in the production process can be prevented from being overdesigned, and unnecessarily strict control can be avoided. This reduces the production costs. At the OPC/MDP step of FIG. 7, calculation needs to be repeated in order to obtain desired pattern geometries. With the desired pattern geometries that are suitably defined by the tolerance, the number of calculations that are to be repeated can be reduced because, for example, a gate pattern that belongs to the NetB has a larger range of specifications.

(Simple Tolerance Generation Method)

Figure 13:
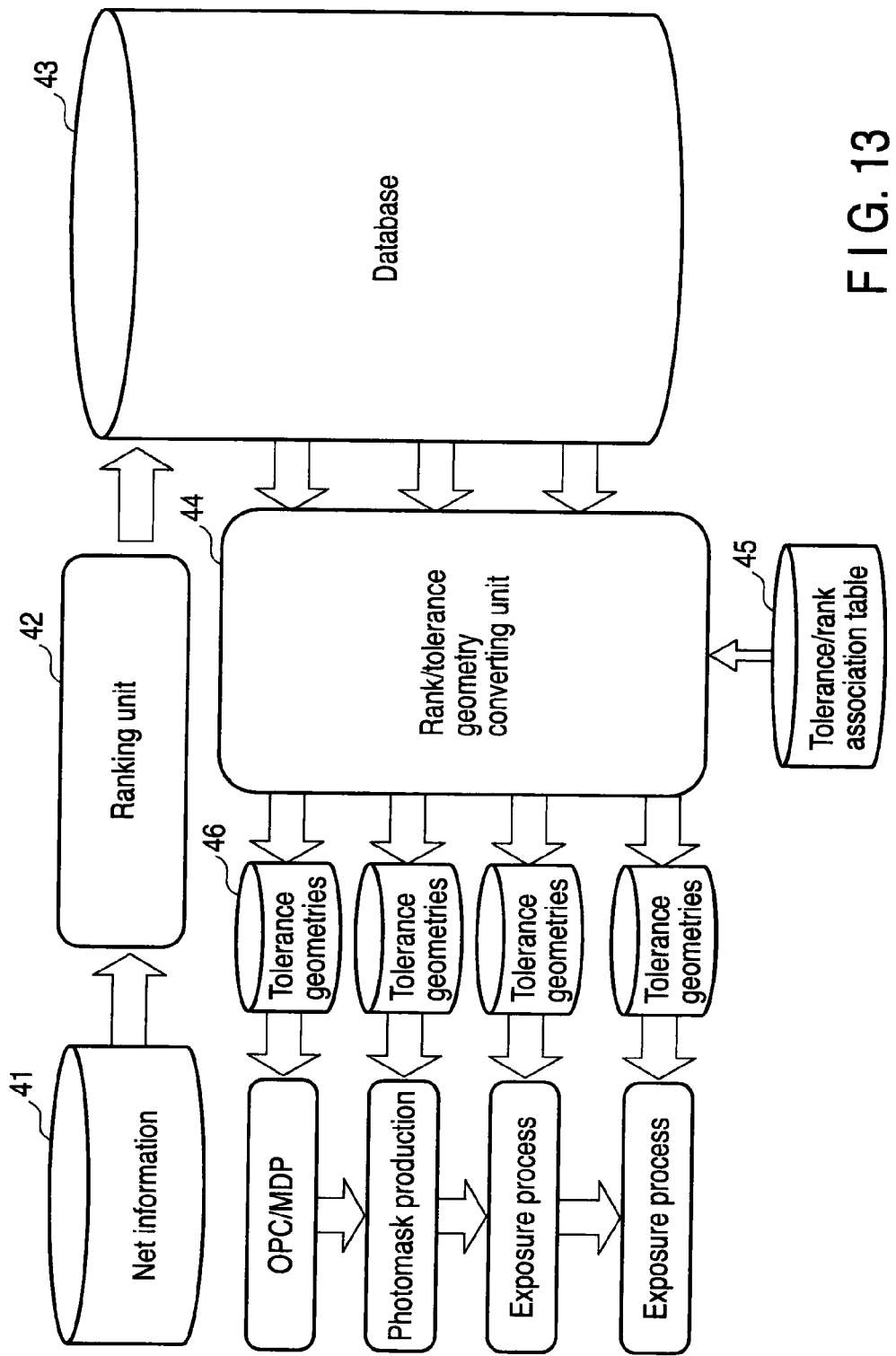
FIG. 13 is a diagram for showing an example structure of a method of determining a tolerance from design information.

Now, a method of determining a tolerance in a simple manner from the design information will be explained with reference to FIG. 13. As described above, the timing margin is calculated for each net in the timing closure process. According to the second embodiment, the device specifications are determined from the specific values of the timing margins.

In contrast, according to this example, the timing margins are not specified as numerical values, but are grouped in accordance with specific ranges for ranking. In other words, as illustrated in FIG. 13, a timing margin is stored for each interconnect (net) as design information in a storage unit 41. A ranking unit 42 retrieves timing margins for the nets from the storage unit 41 and determines ranking of the timing margins. For example, a net having the timing margin less than or equal to 30 ps is in rank 1, and a net having a larger timing margin is in rank 2.

In the example of FIG. 7, the NetA having a timing margin of 10 ps is in rank 1, while the NetB having a timing margin of 50 ps is in rank 2. In this example, the nets are divided into two ranks for the sake of convenience, but the ranking is not limited thereto. The nets may be divided into more than two ranks.

The net information subjected to the ranking is stored in a database 43.

A rank/tolerance geometry (tolerance pattern) converting unit 44 converts the ranked net information of the database 43 to tolerance geometries, based on a table showing the tolerance/rank relationship stored in a storage unit 45.

The table in the storage unit 45 is created in the following manner. For example, when a tolerance is determined for a pattern that belongs to rank 1, for which the timing margin is between 0 and 30 ps, the device specification that should be satisfied is determined to between 50 and 80 ps by adding the design margin of 50 ps to the timing margin.

Here, the tolerance having the strictest value of 50 ps is determined. If this tolerance is satisfied, the net that belongs to rank 1 satisfies all the device specifications. For example, at the OPC/MDP step of the gate pattern formation, a budget of 5% is provided, as indicated in FIG. 8. Thus, the device specification can be calculated as 50×0.05=2.5 ps. Because the variation of timing in accordance with the variation in the gate pattern dimensions is 6.0 ps/mm, the tolerance is 2.5/6.0=0.42 nm.

As for a net that belongs to rank 2, because the timing margin exceeds 30 ps, a tolerance of 80 ps is determined for the strictest net by adding the design margin to the timing margin. As for the OPC/MDP step of the gate pattern formation, a budget of 5% is provided in a similar manner to the above. Thus, the device specification can be calculated as 80×0.05=4.0 ps. The variation of timing in accordance with the variation in the gate pattern dimensions is 6.0 ps/nm. Hence, the tolerance is 4.0/6.0=0.67 nm.

The above calculations are performed in advance, and ranks and tolerances are brought into association with each other and stored as a table in the storage unit 45 in such a manner as rank 1 corresponding to the tolerance of 0.42 nm and rank 2 corresponding to the tolerance of 0.67 nm.

The rank/tolerance geometry converting unit 44 converts the net information stored for each rank in the database 43 to tolerance geometries that correspond to each process, by use of the table stored in the storage unit 45 that shows the relationship between the rank and the tolerance. The converted tolerance geometries are stored in a storage unit 46 for each process.

In this example, because values such as design timings are sorted and stored as ranks, the required capacity of the database 43 can be reduced.

Furthermore, because the relationship between ranks and tolerances can be stored in the storage unit 45 in the form of a table, conversion of ranks to tolerances can be easily performed.

(Sensitivity Determination Method)

Next, a method of determining sensitivity as a physical quantity defining the properties of the semiconductor device according to the second embodiment will be explained with reference to FIGS. 14, 15A and 15B.

Figure 14:
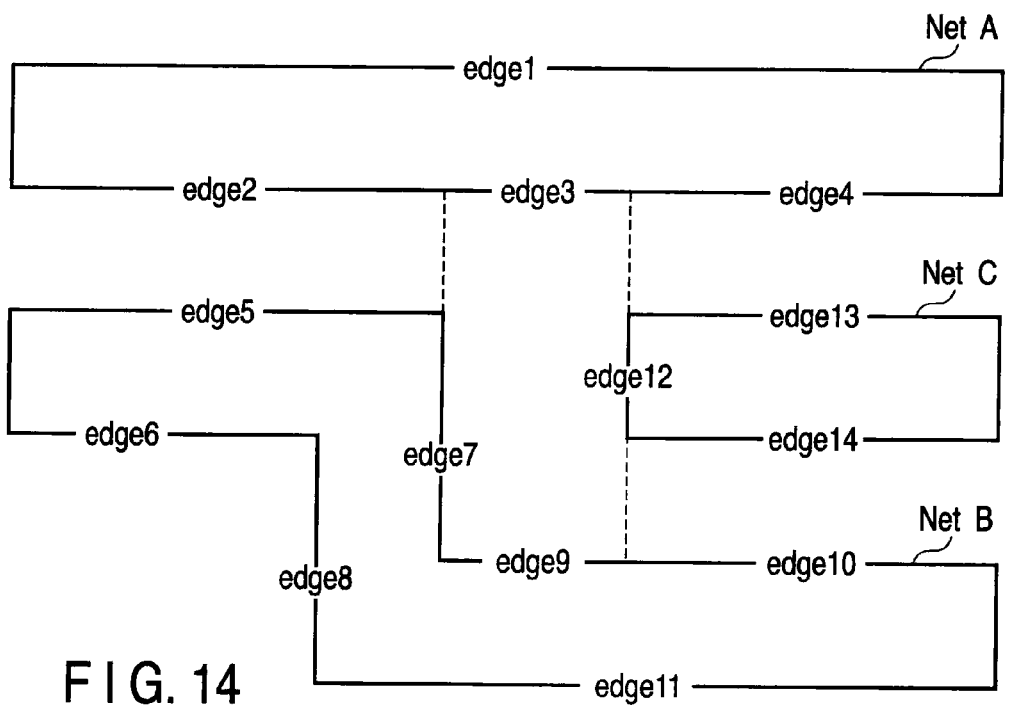
FIG. 14 is a diagram for explaining the sensitivity of an interconnect pattern.

For instance for an interconnect pattern as illustrated in FIG. 14, parasitic capacitances and resistances are extracted before the timing closure. By giving perturbations to each edge of the interconnect pattern, variations in the capacitance and resistance can be obtained in accordance with variations in the target edge by a unit length.

FIG. 15A showing extraction results of interconnect capacitances and parasitic capacitances offers an example of a conversion table indicating the relationship of the edge length, interconnect capacitance and the parasitic capacitance that are extracted in advance of the timing closure. The conversion table indicates the sensitivity, and how the capacitance and resistance would change when, for example, the edge length of the interconnect pattern is changed by 5 nm can be figured out by use of this conversion table. Moreover, the entire capacitance and resistance between flip-flop circuits connected to the interconnect (net) including the target edge can also be obtained.

For example, the variation of each edge can be obtained by measuring the interconnect pattern that belongs to the critical path. Based on these results, the final values of the capacitance and resistance of the critical path can be predicted. Because the relationship between the interconnect capacitance/resistance and the timing is known, the influence that the capacitance and resistance have on the timing can be calculated. Hence, whether the timing satisfies the device specifications can be determined.

According to the above embodiments, the operations of the semiconductor device are determined based on the signal transmission timing, but are not limited thereto. For instance, at least any one of an IR-drop, leakage current, and cross talk noise can be adopted.

In addition, the physical quantity that defines the properties of the semiconductor device is not limited to the width of the pattern. For example, the dimensions between patterns, relative positions of edges, film thicknesses, or impurity dosages may be adopted.

Further, according to the above embodiments, the production process of the semiconductor device includes a mask production process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for controlling processes for producing a semiconductor device, the method comprising:
   measuring, after a first process is performed, a process result at a predetermined position of a pattern to which the first process is applied;
   calculating a deviation of the process result from a predetermined target result that is desired to be obtained by performing the first process;
   quantitatively obtaining, based on the deviation, a degree of influence on an operation specification of the semiconductor device; and
   comparing the degree of influence with a predetermined allowable margin for the operation specification.

2. The method according to claim 1, wherein, when a result of the comparison shows that the degree of influence does not fall within the allowable margin, the method further comprises:
   determining whether it is possible to redo the first process; and
   redoing the first process when it is possible.

3. The method according to claim 1, wherein the allowable margin is determined based on an error budget assigned to the first process.

4. The method according to claim 3, wherein a timing margin of a net is determined in correspondence with the first process, based on the error budget.

5. The method according to claim 1, wherein the operation specification includes a signal transmission timing.

6. The method according to claim 1, wherein, when a result of the comparison shows that the degree of influence does not fall within the allowable margin, the method further comprises:
   determining whether the allowable margin is satisfied by modifying a process parameter of a second process which is to be performed after the first process is determined.

7. The method according to claim 6, wherein when the allowable margin is not satisfied by modifying the process parameter of the second process, the method further comprises:
   determining whether it is possible to redo the first process; and
   redoing the first process when it is possible.

8. The method according to claim 6, wherein the allowable margin is determined based on an error budget assigned to the first process.

9. The method according to claim 8, wherein a timing margin of a net is determined in correspondence with the first process, based on the error budget.

10. The method according to claim 6, wherein the device specification includes a signal transmission timing.

11. A method for controlling processes for producing a semiconductor device, the method comprising:
    measuring monitoring, after a first process is performed, a process result at a predetermined position of a pattern to which the first process is applied;

calculating a deviation of the process result from a predetermined target result that is desired to be obtained by performing the first process;

obtaining a process tolerance based on a predetermined allowable margin of an operation specification of the semiconductor device and a degree of influence with respect to the deviation of the process result on the operation specification; and comparing the obtained process tolerance with the obtained deviation of the process result.

12. The method according to claim 11, further comprising:

determining whether the allowable margin is satisfied by modifying a process parameter of a second process which is to be performed after the first process; and determining, when the allowable margin is not satisfied by modifying the process parameter of the second process, whether it is possible to redo the first process; and redoing the first process when it is possible.

13. The method according to claim 11, wherein the tolerance is stored in association with a rank that is obtained by sorting margins of a pattern included in design information.

14. The method according to claim 11, wherein the allowable margin of the operation specification is determined based on an error budget assigned to the first process.

15. The method according to claim 14, wherein a timing margin of a net is determined in correspondence with the first process, based on the error budget.

16. The method according to claim 11, wherein the operation specification includes a signal transmission timing.

17. A program for controlling processes for producing a semiconductor device, the program being stored in a non-transitory computer-readable medium and, when executed, controlling a computer to perform following steps:

measuring, after a first process is performed, a process result at a predetermined position of a pattern to which the first process is applied;

calculating a deviation of the process result from a predetermined target result that is desired to be obtained by performing the first process;

quantitatively obtaining, from the deviation, a degree of influence on an operation specification of the semiconductor device; and comparing the degree of influence with a predetermined allowable margin for the operation specification.

18. The program according to claim 17, wherein, when a result of the comparison shows that the degree of influence does not fall within the allowable margin, the program further controls the computer to:

determine whether it is possible to redo the first process; and redo the first process when it is possible.

19. The program according to claim 17, wherein, when a result of the comparison shows that the degree of influence does not fall within the allowable margin, the program further controls the computer to determine whether the allowable margin is satisfied by modifying a process parameter of a second process which is to be performed after the first process.

20. The program according to claim 17, wherein the program further controls the computer to determine allowable margin of the operation specification based on an error budget assigned to the first process.

* * * * *

UNITED STATES PATENT AND TRADEMARK OFFICE
CERTIFICATE OF CORRECTION

PATENT NO. : 8,285,412 B2  Page 1 of 1
APPLICATION NO. : 12/480355
DATED : October 9, 2012
INVENTOR(S) : Kyoh It is certified that error appears in the above-identified patent and that said Letters Patent is hereby corrected as shown below:

Claim 11, column 14, line 65, change "measuring monitoring," to --measuring,--

Signed and Sealed this
Fifteenth Day of January, 2013

David J. Kappos
*Director of the United States Patent and Trademark Office*